(12) United States Patent
Toguchi et al.

(10) Patent No.: US 7,598,669 B2
(45) Date of Patent: Oct. 6, 2009

(54) LIGHT-EMITTING DIODE, ITS MANUFACTURING METHOD, AND DISPLAY DEVICE USING THE SAME

(75) Inventors: Satoru Toguchi, Tokyo (JP); Hitoshi Ishikawa, Tokyo (JP); Atsushi Oda, Yonezawa (JP)

(73) Assignee: Samsung Mobile Display Co., Ltd., Suwon (KR)

( * ) Notice: Subject to any disclaimer, the term of this patent is extended or adjusted under 35 U.S.C. 154(b) by 623 days.

(21) Appl. No.: 10/509,800

(22) PCT Filed: Mar. 27, 2003

(86) PCT No.: PCT/JP03/03850

§ 371 (c)(1),
(2), (4) Date: Sep. 29, 2004

(87) PCT Pub. No.: WO03/084291

PCT Pub. Date: Oct. 9, 2003

(65) Prior Publication Data

US 2005/0127832 A1   Jun. 16, 2005

(30) Foreign Application Priority Data

Mar. 29, 2002   (JP) .............................. 2002-096704

(51) Int. Cl.
*H01J 63/04* (2006.01)
*H01J 1/62* (2006.01)

(52) U.S. Cl. ........................ 313/506; 313/483; 313/503; 313/504; 313/505

(58) Field of Classification Search ................. 313/503, 313/512; 362/326
See application file for complete search history.

(56) References Cited

U.S. PATENT DOCUMENTS 6,472,817 B1 * 10/2002 Kawase ....................... 313/504
2001/0019242 A1 * 9/2001 Tada et al. ................... 313/504

FOREIGN PATENT DOCUMENTS

GB        2350479        11/2000

(Continued)

OTHER PUBLICATIONS

Chinese Office Action dated Mar. 21, 2008.

*Primary Examiner*—Nimeshkumar D. Patel
*Assistant Examiner*—Natalie K Walford
(74) *Attorney, Agent, or Firm*—H.C. Park & Associates, PLC

(57) ABSTRACT

Provided is a light emitting diode and method for fabricating the same, and a display device using the same, wherein the light emitting diode at least comprises a high refractive index layer on a light transmissive substrate; and an organic electroluminescence (EL) element formed of one organic thin layer or a plurality of organic thin layers interposed between a transparent first electrode and a second electrode formed on the high refractive index layer, and the high refractive index layer has a refractive index higher than that of an emitting layer or has a refractive index of 1.65 or more, and an interface between the high refractive index layer and the light transmissive substrate is roughed to have its center line average roughness in a range of 0.01 μm to 0.6 μm so that light leakage is be prevented and light extraction efficiency becomes higher.

14 Claims, 6 Drawing Sheets

FOREIGN PATENT DOCUMENTS

| | | |
|---|---|---|
| JP | 10-172756 | 6/1998 |
| JP | 11-329742 | 11/1999 |
| JP | 11329742 A * | 11/1999 |
| JP | 2000-260571 | 9/2000 |
| JP | 2001-202827 | 7/2001 |
| JP | 2001-230069 | 8/2001 |
| JP | 2002-56968 | 2/2002 |
| JP | 2002056968 A * | 2/2002 |

* cited by examiner

LIGHT-EMITTING DIODE, ITS MANUFACTURING METHOD, AND DISPLAY DEVICE USING THE SAME

TECHNICAL FIELD

The present invention relates to an organic electroluminescent (organic EL) element and, more particularly, to a light emitting diode having superior light extraction efficiency such that light emitted from the organic EL element is not leaked to an adjacent region of the organic EL element, and a display device using the same.

BACKGROUND ART

An organic EL element is an emissive element using a principle that a fluorescent material emits light by means of recombination energy of holes injected from an anode and electrons injected from a cathode when an electric field is applied thereto. Researches have been conducted with regard to the organic EL element comprised of an organic material after C. W. Tang and S. A. VanSlyke of EASTMAN KODAK, Co. reported a low voltage driving organic EL element using a stacked device in Applied Physics Letters, Vol. 51, pp. 913 (1987).

Tang et al fabricates the organic EL element using tris(8-quinolinol)aluminum for an emitting layer and triphenyldiamine derivative for a hole transporting layer on a glass substrate. Such stacked type structure has advantages in that efficiency of injecting the hole into the emitting layer may be increased, efficiency of creating excitons resulted from recombination by blocking electron injected from the cathode may be increased, and the excitons created in the emitting layer may be trapped. For the structure of the organic EL element as mentioned above, a two layered type consisting of a hole transporting (injecting) layer and a hole transportable emitting layer, or a three layered type consisting of a hole transporting (injecting) layer, a light-emitting layer and an electron transporting (injecting) layer are well known in the art.

Researches for the element structure or a method for forming the same are conducted in order to increase the recombination efficiency of the injected electron and hole in the stacked type element.

However, the organic EL element has a limit for the probability of singlet generation due to dependency of spin statistics when carriers are recombined, which causes to have an upper limit of light emitting probability. The value of such upper limit is expected to be about 25%. In addition, the light of exiting angle larger than critical angle is fully reflected due to the refractive index of the light emitting body in the organic EL element, so that the light may not be extracted outside the substrate. It is expected that only 20% of the total amount of light emitted is available when the refractive index of the light emitting body is 1.6, As such, energy converting efficiency becomes inevitably low, which is limited to be about 5% (0.25×0.2=0.05) in total even when singlet creation probability is added to, which was reported by Tsutsui Tetsuo in [phenomena and trend of organic electroluminescent device], Monthly Display, Vol. 1, No. 3, pp. 11, September (1995). In the organic EL element that has a light emitting probability highly limited, low light extraction efficiency as mentioned above causes degradation of the energy converting efficiency, which may be severely and adversely affected.

As for the technique of improving the light extraction efficiency, several proposals have been suggested using the light emitting diode having the same structure as that of an inorganic EL element in the prior art. For example, JP patent laid-open publication No. 1988-314795 discloses a method for forming a lens on a substrate with a focusing property to improve the efficiency, which is efficient for a device having a large emitting area, however, it is difficult to form the lens with the focusing property in a device such as a dot matrix display device in which each pixel area is fine. In addition, JP patent laid-open publication No. 1987-172691 discloses a method for forming anti-reflective layer by introducing a planarizing layer that may have a medium refractive index between the glass substrate and the light-emitting layer, which improves the light extraction efficiency for the front direction, however, may not effectively prevent total reflection. Thus, it is not effective for the organic EL element having a relatively low refractive index, but effective for the inorganic EL element having a high refractive index.

In addition, JP patent laid-open publication No. 2000-231985 discloses a method for reducing total reflection at a plane not in contact with the organic EL element of the substrate by using the technique that the plane has a function of diffusing light, however, its effect is not significant because the rate of light totally reflected is high at an interface between the organic EL element and the glass substrate that has been conventionally used.

In addition, when a light emitting diode where a plurality of organic EL elements are arranged is fabricated using the substrate with such light diffusion function, light emitted is from the organic EL element reaches pixel regions adjacent to the element, which causes the light to be leaked and observed even at a non-emitting pixel. JP patent laid-open publication No. 1999-8070 discloses a technique for forming a black mask and a light diffusing layer between the substrate and the organic EL element to solve the light leakage problem.

However, some of the lights are absorbed by the black mask so that the light extraction efficiency is further degraded.

As such, the method for improving the light extraction efficiency and preventing the light leakage of the light emitting diode using the organic EL element is not sufficient, and the above mentioned problem must be inevitably overcome to put the organic EL element to practical use.

DISCLOSURE OF INVENTION

It is, therefore, an objective of the present invention to provide light emitting diode and display device of high performance by preventing light leaking from the light emitting diode and improving light extraction efficiency using the organic EL element.

According to claim 1 of the present invention, there is provided a light emitting diode, at least comprising a high refractive index layer on a light transmissive substrate; and an organic electroluminescence (EL) element formed of one organic thin layer or a plurality of organic thin layers interposed between a transparent first electrode and a second electrode, wherein the high refractive index layer has a refractive index of 1.65 or more, and an interface between the high refractive index layer and the light transmissive substrate has its center line average roughness in a range of 0.01 μm to 0.6 μm.

According to claim 2 of the present invention, there is provided a light emitting diode, at least comprising a high refractive index layer on a light transmissive substrate; and an organic electroluminescence (EL) element formed of one organic thin layer or a plurality of organic thin layers interposed between a transparent first electrode and a second electrode, wherein the high refractive index layer has a refractive index higher than that of an light-emitting layer, and an interface between the high refractive index layer and the light transmissive substrate has its center line average roughness in a range of 0.01 μm to 0.6 μm.

According to claim 3 as claimed in claim 1, the interface between the light transmissive substrate and the high refractive index layer has a developing area ratio of 1.02 or more.

According to claim 4 as claimed in claim 2, the interface between the light transmissive substrate and the high refractive index layer has a developing area ratio of 1.02 or more.

According to claim 5 as claimed in claim 1 or 3, the high refractive index layer is formed of $Si_3N_4$.

According to claim 6 as claimed in claim 2 or 4, the high refractive index layer is formed of $Si_3N_4$.

According to claim 7 as claimed in any one of claims 1, 3, and 5, the light transmissive substrate is formed of a plurality of light transmissive layers, and the light transmissive layer in contact with the high refractive index layer has a refractive index lower than those of the rest light transmissive layers.

According to claim 8 as claimed in any one of claims 2, 4, and 6, the light transmissive substrate is formed of a plurality of light transmissive layers, and the light transmissive layer in contact with the high refractive index layer has a refractive index lower than those of the rest light transmissive layers.

According to claim 9 as claimed in claim 7, the light transmissive layer in contact with the high refractive index layer is formed of porous silica.

According to claim 10 as claimed in claim 8, the light transmissive layer in contact with the high refractive index layer is formed of porous silica.

According to claim 11 as claimed in any one of claims 1, 3, 5, 7, and 9, the interface between the high refractive index layer and the light transmissive substrate is shaped by a back sputtering method with respect to the light transmissive substrate.

According to claim 12 as claimed in any one of claims 2, 4, 6, 8, and 10, the interface between the high refractive index layer and the light transmissive substrate is shaped by a back sputtering method with respect to the light transmissive substrate.

According to claim 13 as claimed in any one of claims 1, 3, 5, 7, and 9, the interface between the high refractive index layer and the light transmissive substrate is shaped such that it becomes a thin layer having a coverage of 1 or less on the light transmissive substrate and the substrate having the thin layer is subsequently etched.

According to claim 14 as claimed in any one of claims 2, 4, 6, 8, and 10, the interface between the high refractive index layer and the light transmissive substrate is shaped such that it becomes a thin layer having a coverage of 1 or less on the light transmissive substrate and the substrate having the thin layer is subsequently etched.

According to claim 13 as claimed claim 8, the high refractive index layer has a thickness of 0.4 μm to 2 μm.

According to claim 6 as claimed in claim 1, the high refractive index layer has a thickness of 0.4 μm to 2 μm.

According to claim 14 as claimed in claim 8, there is provided a display device in which a plurality of light emitting diodes are arranged.

According to claim 7 as claimed in claim 1, there is provided a display device in which a plurality of light emitting diodes are arranged.

BRIEF DESCRIPTION OF THE DRAWINGS

The above and other features and advantages of the present invention will become more apparent to those of ordinary skill in the art by describing in detail preferred embodiments thereof with reference to the attached drawings in which.

Figure 1:
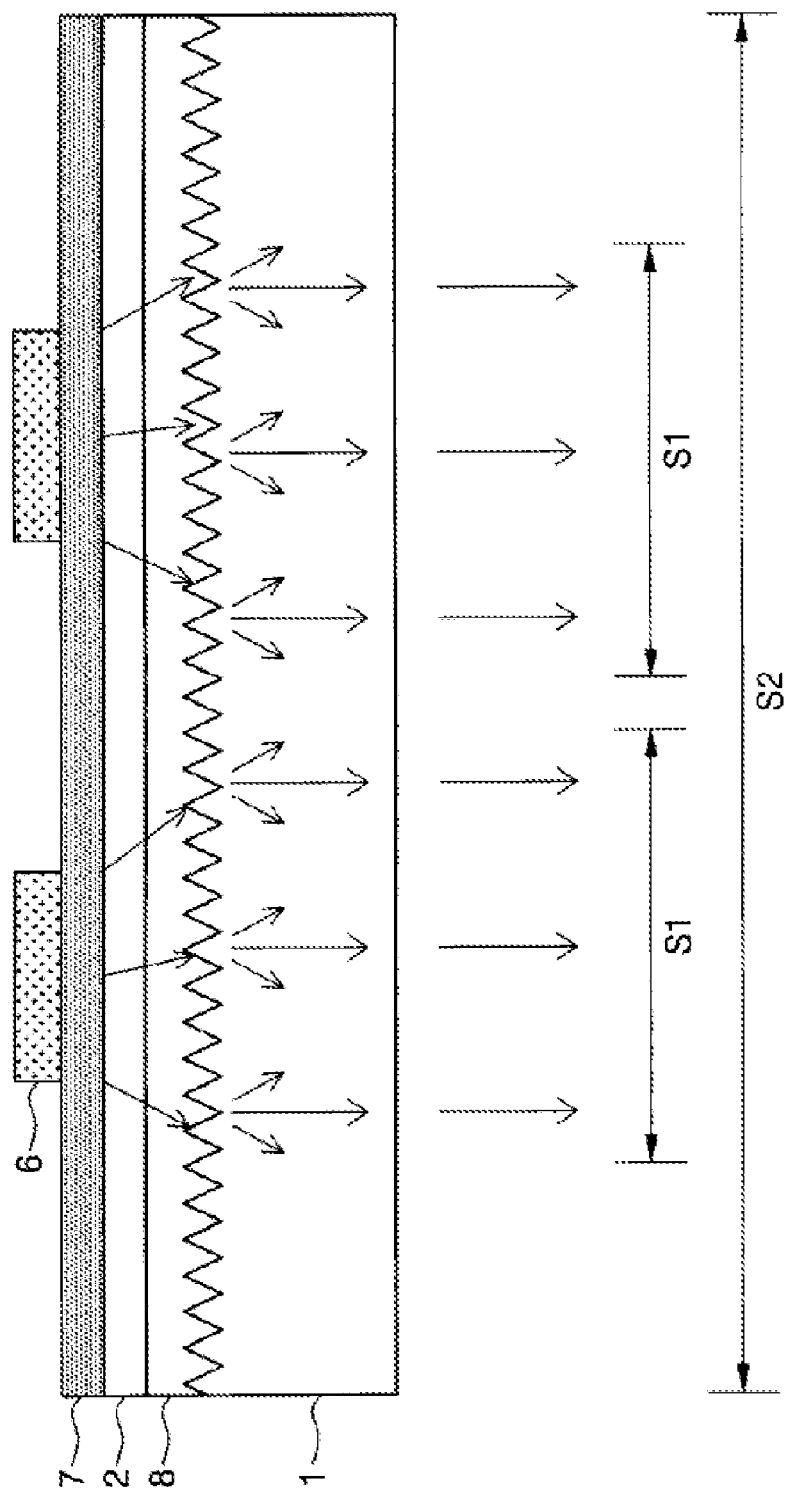
FIG. 1 is a cross sectional view of a light emitting diode of the present invention.

In addition, numerical reference 1 indicates a light transmissive substrate. Numerical reference 2 indicates a first electrode. Numerical reference 3 indicates a hole transporting layer. Numerical reference 4 indicates a light-emitting layer. Numerical reference 5 indicates an electron transporting layer. Numerical reference 6 indicates a second electrode. Numerical reference 7 indicates an organic thin layer (e.g., hole transporting layer 3, light-emitting layer 4, electron transporting layer 5). Numerical reference 8 indicates a high refractive index layer. Numerical reference 9 indicates a low refractive index light transmissive layer.

BEST MODE FOR CARRYING OUT THE INVENTION

The present invention will now be described more fully hereinafter with reference to the accompanying drawings, in which preferred embodiments of the invention are shown. This invention may, however, be embodied in different forms and should not be construed as limited to the embodiments set forth herein.

Inventors of the present invention have carefully checked the above-mentioned problems in the light emitting diode using the organic EL element and have found out that the light leakage may be suppressed to improve the light extraction efficiency by forming a high refractive index layer on a light transmissive substrate so as to have a refractive index higher than that of the light-emitting layer of the organic EL element or have its value more than 1.65, forming the organic EL element, and having center line average roughness of an interface between the high refractive index layer and the light transmissive substrate in a range of 0.01 μm to 0.6 μm.

In addition, They have found out that the light leakage may be further suppressed to obtain the light emitting diode with the improved light extraction efficiency by having a thickness of the high refractive index layer in a range of 0.4 μm to 2 μm and a developing area ratio of the interface of 1.02 or more.

In this case, the developing area ratio means a value obtained from S2/S1, wherein S1 indicates an area where roughed portion on the light transmissive substrate is projected in the light transmissive substrate, and S2 indicates a surface area of the roughed portion on the light transmissive substrate.

In addition, they have found out that the light leakage may be further suppressed to obtain the light emitting diode with the improved light extraction efficiency by forming the light transmissive substrate with a plurality of light transmissive layers, and having the refractive index of a light transmissive layer in contact with the high refractive index layer smaller than those of the rest light transmissive layers.

Figure 2:
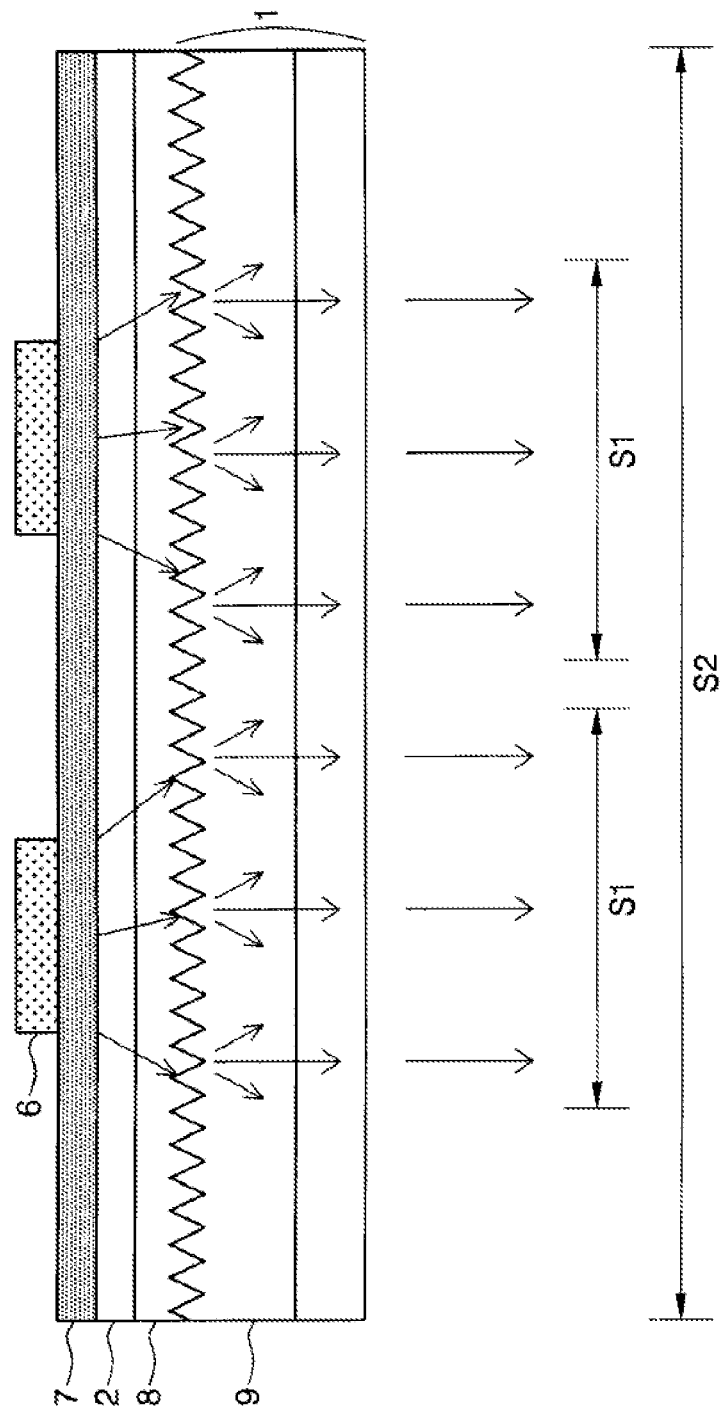
FIG. 2 is a cross sectional view of an organic EL element used for the present invention.
Figure 3:
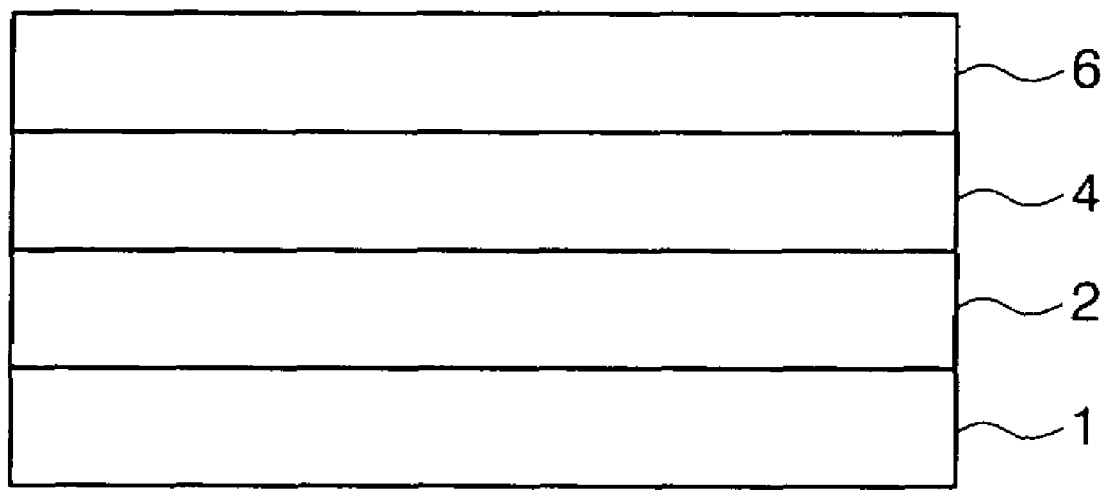
FIG. 3 is a cross sectional view of an organic EL element used for the present invention.
Figure 4:
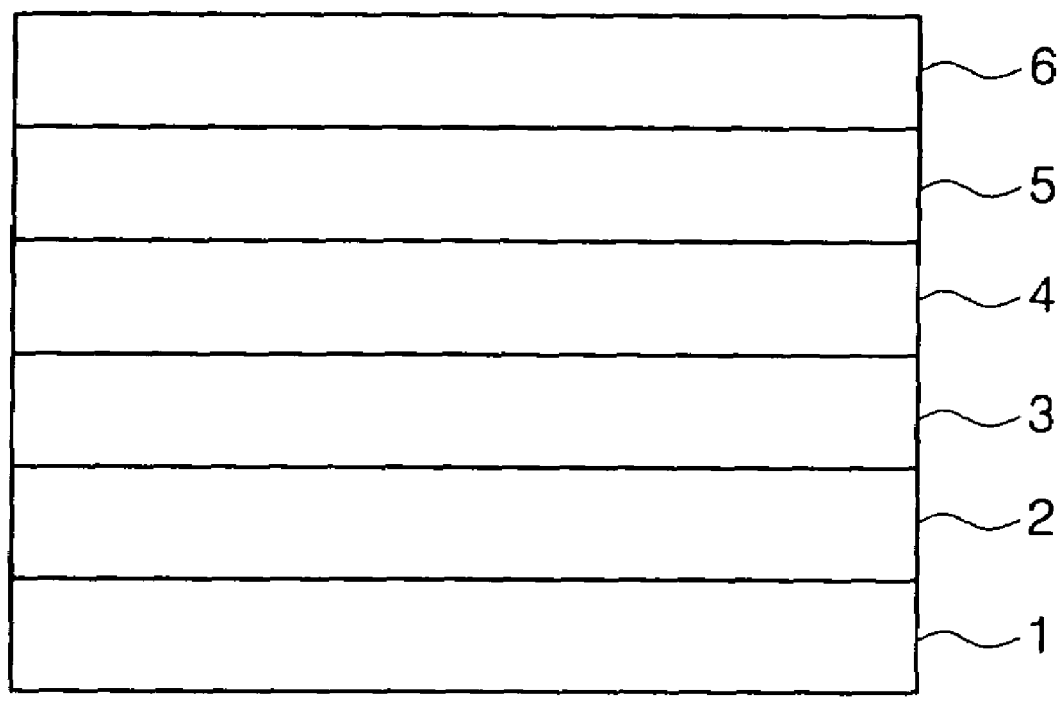
FIG. 4 is a cross sectional view of an organic EL element used for the present invention.
Figure 5:
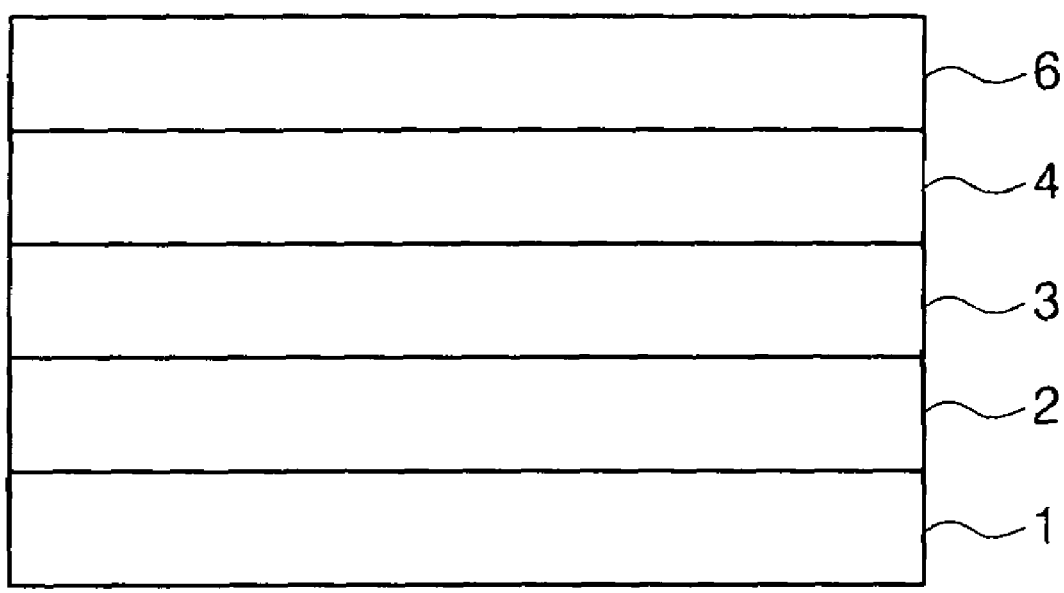
FIG. 5 is a cross sectional view of an organic EL element used for the present invention.
Figure 6:
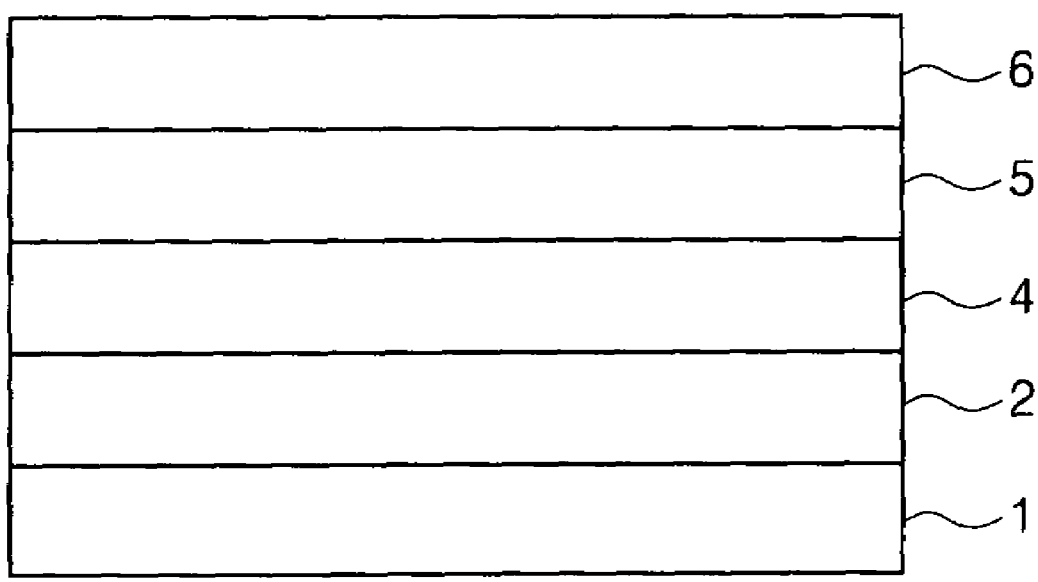
FIG. 6 is a cross sectional view of an organic EL element used for the present invention.

FIG. 1 and FIG. 2 are cross sectional views of the light emitting diode of the present invention. In the conventional organic EL element, only about 20% of the light emitted from the light-emitting layer is effectively extracted due to losses at two interfaces between the organic EL element and the substrate and between the substrate and air. A high refractive index layer having a refractive index more than 1.65 or a refractive index higher than that of the light-emitting layer may be formed between a first transparent electrode and the light transmissive substrate, which leads to reduce the rate of light lost by trapping in the organic EL element and to extract more light toward the high refractive index layer, however, the total light extraction efficiency is not changed due to an increase of light rate lost at interfaces between the high refractive index layer and the light transmissive substrate and between the light transmissive substrate and air.

The interface between the high refractive index layer and the light transmissive substrate may be roughed to have the light exited and reflected in several directions from the interface, which allows to reduce the rate of light that do not exit from the high refractive index layer toward the light transmissive substrate, however, such isotropic diffusion still causes not only reduced light extraction efficiency but also light leakage into adjacent pixels due to the increased rate of light lost at the interface between the light transmissive substrate and air.

In this case, when the interface between the high refractive index layer and the light transmissive substrate is roughed to have a center line average roughness in a range of 0.01 μg or to 0.6 μm, rate of light propagating in a direction normal to the substrate plane of the light transmissive substrate increases among light introduced from the high refractive index layer to the light transmissive substrate. The component of the light propagating to the normal direction of the light transmissive substrate is not reflected from the interface between the light transmissive substrate and air, but exits into the air, so that the light loss at the interface between the high refractive index layer and the light transmissive substrate may be reduced and the light extraction efficiency may be improved. In addition, when the component of the light propagating in a direction normal to the plane of the light transmissive substrate increases, the rate of the component of light propagating in a direction parallel to the plane of the light transmissive substrate is reduced, which leads to improve the light leakage between adjacent pixels.

When the high refractive index layer is not formed between the light transmissive substrate and the organic EL element, the rate of light trapped in the organic EL element is significantly high, so that the improved light extraction efficiency remains the same. In addition, by means of the developing area ratio of 1.02 or more at the interface between the light transmissive substrate and the high refractive index layer, the rate of light propagating in a direction normal to the substrate plane further increases, which leads to more effectively suppress the light leakage.

In addition, when the high refractive index layer is formed to have its thickness of 0.4□ to 2.0□, light diffusion may be suppressed in a direction parallel to the substrate plane within the high refractive index layer, and the light leakage is effectively suppressed. Furthermore, when the light transmissive substrate is formed of a plurality of stacked light transmissive layers and a light transmissive layer in contact with the high refractive index layer has a refractive index smaller than those of the rest light transmissive layers, light loss is further reduced at the interface between the high refractive index layer and the light transmissive substrate, and the rate of light propagating in a direction normal to the substrate plane further increases, which results in more improved light extraction efficiency.

The interface between the high refractive index layer and the light transmissive substrate may be roughed by any techniques, for example, a back sputtering method or a method for forming a thin layer with coverage of 1 or less and using the same as a mask for performing etching, may be used with respect to the light transmissive substrate to thereby form the high refractive index layer during a vacuum procedure such as CVD or vacuum deposition with $Si_3N_4$ layer, and such interface formation may be performed during the coherent vacuum procedure to obtain the structure for the purpose of low cost.

When the sputtering and vacuum deposition methods are used to form the organic EL element, it may be fabricated by the coherent vacuum procedure ranging from the light transmissive substrate to the light emitting diode, which further increases the effect of simplifying the vacuum procedure.

In other words, the present invention relates to light emitting diodes of (1) to (10) described below.

(1) A light emitting diode, at least comprising: a high refractive index layer on a light transmissive substrate; and an organic electroluminescence (EL) element formed of one organic thin layer or a plurality of organic thin layers interposed between a transparent first electrode and a second electrode formed on the high refractive index layer, wherein the high refractive index layer has a refractive index of 1.65 or more, and an interface between the high refractive index layer and the light transmissive substrate has its center line average roughness in a range of 0.01 μm to 0.6 μm.

(2) A light emitting diode, at least comprising: a high refractive index layer on a light transmissive substrate; and an organic electroluminescence (EL) element formed of one organic thin layer or a plurality of organic thin layers interposed between a transparent first electrode and a second electrode, wherein the high refractive index layer has a refractive index higher than that of a light-emitting layer, and an interface between the high refractive index layer and the light transmissive substrate has its center line average roughness in a range of 0.01 μm to 0.6 μm.

(3) The light emitting diode as described in (1), wherein a developing area ratio of an interface between the light transmissive substrate and the high refractive index layer is 1.02 or more.

(4) The light emitting diode as described in (2), wherein a developing area ratio of an interface between the light transmissive substrate and the high refractive index layer is 1.02 or more.

(5) The light emitting diode as described in (1) or (3), wherein the high refractive index layer is formed of $Si_3N_4$.

(6) The light emitting diode as described in (7) or (9), wherein the high refractive index layer is formed of $Si_3N_4$.

(7) The light emitting diode as described in any one of (1), (3), and (5), wherein the light transmissive substrate is formed of a plurality of light transmissive layers, and the light transmissive layer in contact with the high refractive index layer has a refractive index lower than those of the rest light transmissive layers.

(8) The light emitting diode as described in any one of (2), (4), and (6), wherein the light transmissive substrate is formed of a plurality of light transmissive layers, and the light transmissive layer in contact with the high refractive index layer has a refractive index lower than those of the rest light transmissive layers.

(9) The light emitting diode as described in (7), wherein the light transmissive layer in contact with the high refractive index layer is formed of porous silica.

(10) The light emitting diode as described in (8), wherein the light transmissive layer in contact with the high refractive index layer is formed of porous silica.

(11) The light emitting diode as described in any one of (1), (3), (5), (7), and (9), wherein the interface between the high refractive index layer and the light transmissive substrate is shaped by a back sputtering method with respect to the light transmissive substrate.

(12) The light emitting diode as described in any one of (2), (4), (6), (8), and (10), wherein the interface between the high refractive index layer and the light transmissive substrate is shaped by a back sputtering method with respect to the light transmissive substrate.

(13) The light emitting diode as described in any one of (1), (3), (5), (7), and (9), wherein the interface between the high refractive index layer and the light transmissive substrate is shaped such that it becomes a thin layer having a coverage of 1 or less on the light transmissive substrate and the substrate having the thin layer is subsequently etched.

(14) The light emitting diode as described in any one of (2), (4), (6), (8), and (10), wherein the interface between the high refractive index layer and the light transmissive substrate is shaped such that it becomes a thin layer having a coverage of 1 or less on the light transmissive substrate and the substrate having the thin layer is subsequently etched.

(15) The light emitting diode as described in any one of (1), (3), (5), (7), (9), (11), and (13), wherein the high refractive index layer has a thickness of 0.4 µm to 2 µm.

(16) The light emitting diode as described in any one of (2), (4), (6), (8), (10), (12), and (14), wherein the high refractive index layer has a thickness of 0.4 µm to 2 µm.

(17) A display device in which the light emitting diodes described in any one of (1), (3), (5), (7), (9), (11), (13), and (15) are arranged in plural numbers.

(18) A display device in which the light emitting diodes described in any one of (2), (4), (6), (8), (10), (12), (14), and (16) are arranged in plural numbers.

Preferred Embodiment

The device structure of the organic EL element of the present invention is not specifically limited except that it comprises one organic layer or a plurality of organic layers including at least light-emitting layer between a first electrode and a second electrode. One of the first and second electrodes acts as an anode, and the other acts as a cathode. When the first electrode is the anode and the second electrode is the cathode, as shown in FIG. 3 to FIG. 6 by way of example of the organic EL element, a structure such as ① anode, light-emitting layer, cathode, ② anode, hole transporting layer, light-emitting layer, electron transporting layer, cathode, ③ hole transporting layer, light-emitting layer, cathode, or ④ anode, light-emitting layer, electron transporting layer, cathode may be used. In addition, in order to improve charge injecting characteristics, suppress the insulating coverage, or improve the luminous efficiency, a thin layer formed of insulating material and inorganic dielectric material such as LiF, MgF, SiO, $SiO_2$, $Si_3N_4$, a composite layer formed of organic layer and electrode material or metal, or an organic high molecular thin layer such as polyaniline, polyacetylene derivatives, polydiacetylene derivatives, polyvinyl carbazole derivatives, polyparaphenylvinylene derivatives, may be interposed between the organic layers and between the organic layer electrodes.

Any of typical light emitting materials may be used for the light emitting diode used in the present invention.

By way of example, small molecular light emitting materials such as tris(8-quinolinol)aluminum complex (Alq3)[formula 1], bis-diphenylvinylbiphenyl (BDPVBi)[formula 2], 1,3-bis(p-t-butylphenyl-1,3,4-oxadiazolil)phenyl (OXD-7) [formula 3], N,N'-bis(2,5-di-t-butylphenyl) perylenetetracarbonic acid dimide (BPPC)[formula 4], 1, 4bis(N-p-tril-N-4-(4-methylstyril)phenylamino)naphthalene[formula 5], or high molecular light emitting material such as polyphenylenevinyl polymer may be used, which are denoted as the following formulae:

[Compound 1]

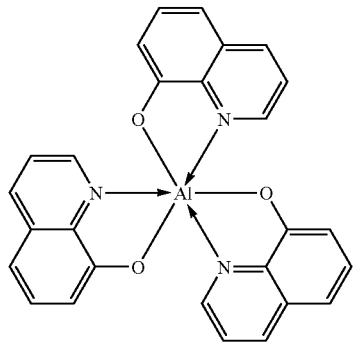

[1]

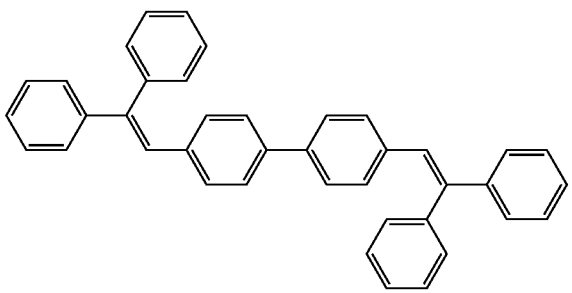

[2]

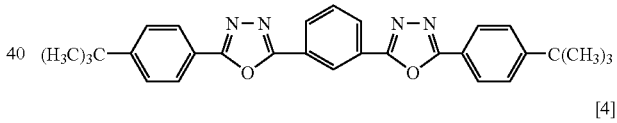

[3]

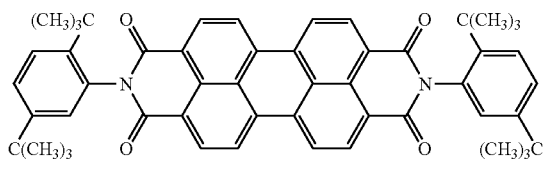

[4]

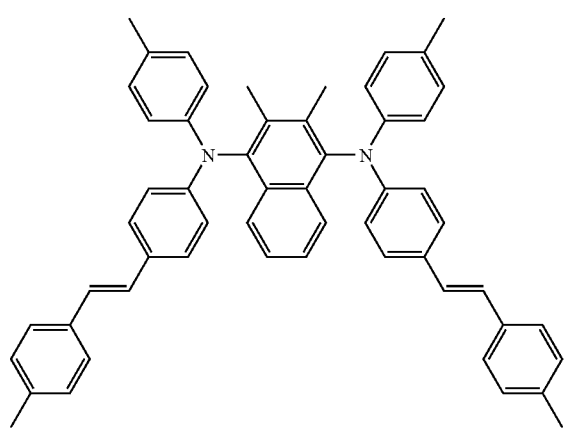

[5]

In addition, a charge transporting material doped with a fluorescent material may be used as the light emitting material. For example, quinolinol metal complex such as the above-mentioned Alq3 [formula 1] may be doped with quinacridone derivatives such as 4-dicianometylene-2-metyl-6-(p-dimetylaminostyril)-4H-pirane(DCM)[formula 6], 2,3-quinacridone [formula 7], 3-(2'benzotiazole)-7-diethylaminocoumarin[formula 8], or bis(2-metyl-hydroxyquinoline)-4-phenylphenol-aluminum complex[formula 9] as electron transporting material may be doped with condensation polycyclic aromatic group such as perylene[formula 10], or 4,4'-bis(m-trilphenylamino)biphenyl(TPD)[formula 11] as hole transporting material may be doped with rubrene[formula 12].

[Compound 2]

[6]
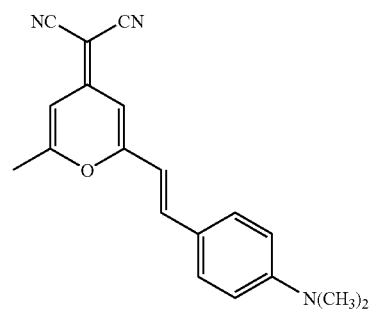

[7]
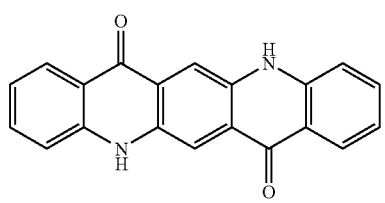

[8]
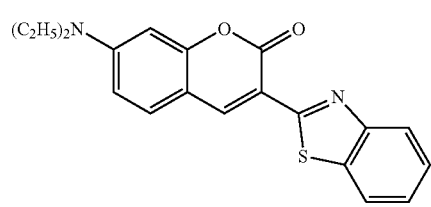

[9]
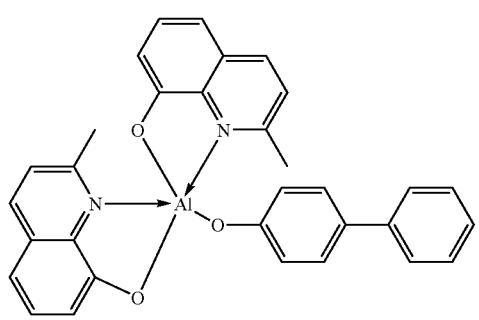

[10]
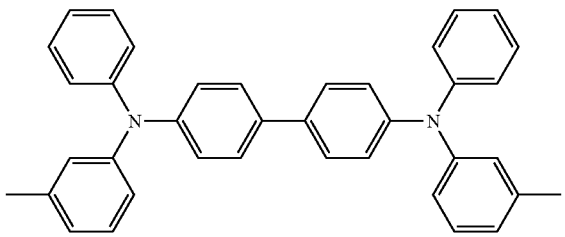

[11]
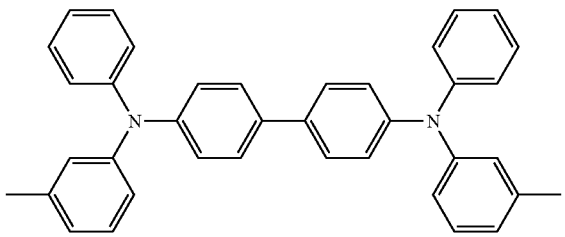

[12]
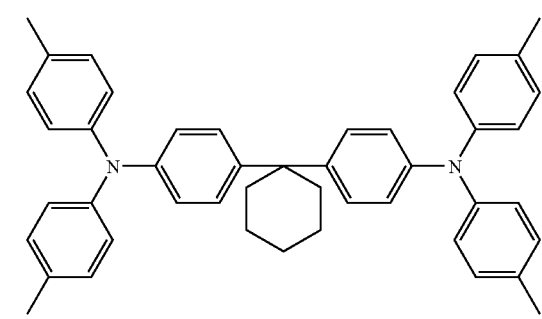

Any of typical hole transporting materials may be used for the hole transporting material used in the present invention.

For example, triphenylenediamine types such as bis(di(p-tril)aminophenyl)-1,1-cyclohexane[formula 13], TPD [formula 11], N,N'-diphenyl-N-N-bis(1-naphtyl)-1,1'-biphenyl)-4,4'-diamine (NPB)[formula 14], or starbust type molecules [formula 15 to 17] may be used.

[Compound 3]

[13]
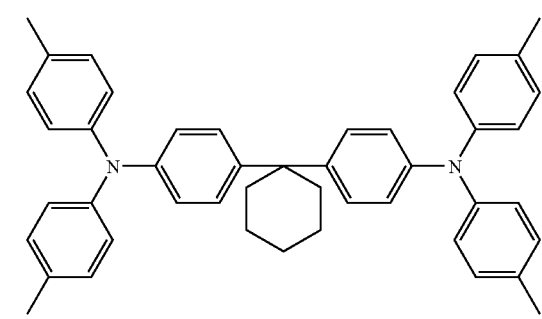

[14]
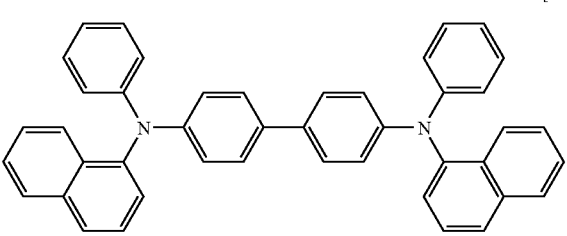

-continued

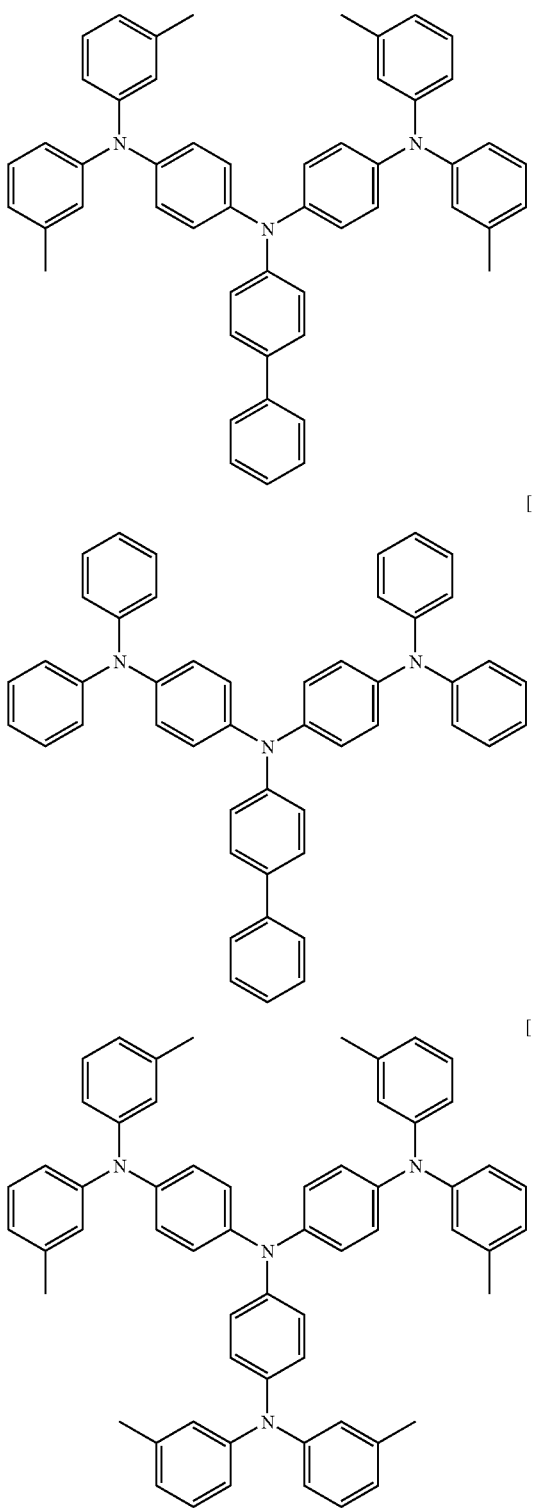

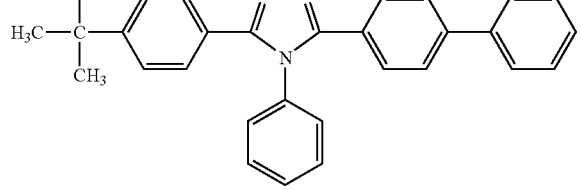

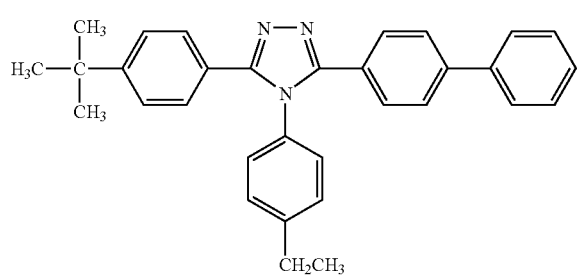

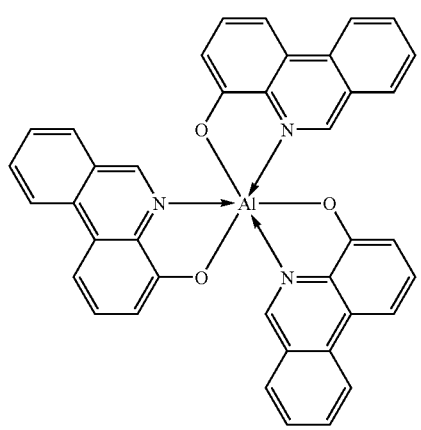

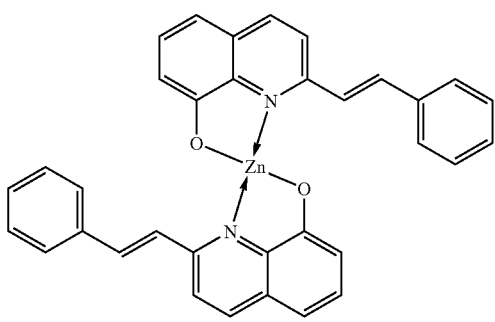

Any of typical compounds for electron transporting material may be used for the electron transporting material used in the present invention. For example, oxadiazole derivatives such as 2-(4-biphenyril)-5-)₄-t-butylphenyl)-1,3,4-oxadiazole(Bu-PBD)[formula 18], IOXD-7[formula 3], triazole derivatives [formula 19, 20, etc], or quinolinol based metal complex [formula 1, 9, 21 to 24] may be used.

[Compound 4]

-continued

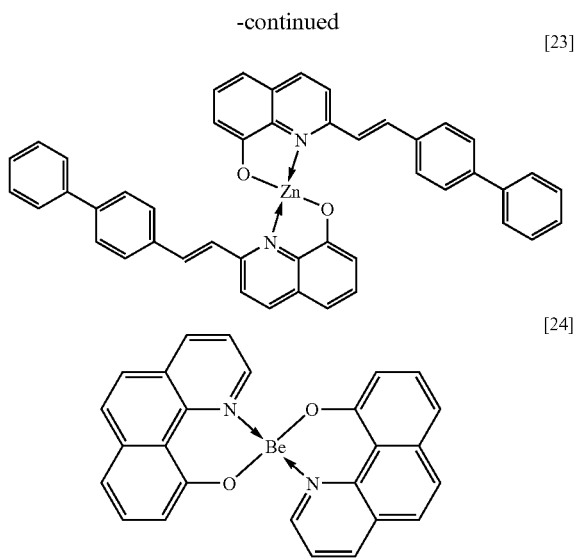

[23]

[24]

The anode of the organic thin film EL element acts to have holes injected into the hole transporting layer and effectively has a work function of 4.5 eV or more. Specific examples thereof used in the present invention include ITO, NESA, Au, Ag, Pt, Cu, etc. In addition, the cathode preferably has a low work function so as to inject electrons into the electron transporting band or the light-emitting layer. Material used for the cathode is not specifically limited, however, may include In, Al, Mg, Mg—In, Mg—Al, Al—Li, Al—Sc—Li, Mg—Ag.

A method for forming each layer of the organic EL element of the present invention is not specifically limited. Conventional well-known methods such as a vacuum evaporation method and a spin coating method may be used. The organic thin layer containing the compound used for the organic EL element of the present invention may be formed by well-known methods including vacuum evaporation, molecular beam evaporation (MBE), soaking in solvent solution, spin coating, casting, bar coating or roll coating.

The thickness of the light-emitting layer, hole transporting layer, electron transporting layer of the organic EL element is not specifically limited, however, when it is too thin, defects such as pin hole may occur, on the other hand, when it is too thick, a higher voltage is required to thereby lower the efficiency, so that it is preferable to adjust the thickness in range of several nanometers to one micrometer.

The high refractive index layer of the present invention has a refractive index higher than that of the light-emitting layer or has a refractive index more than 1.65. Materials used for this configuration may include a high refractive optical glass such as FD-11, LaK3, BaF10, LaF2, SF13, SFS1, an inorganic material such as $ZrO_2$, $Ta_2O_5$, sapphire glass, titania glass, ZnSe, $Si_3N_4$, or a sulfone contained resin such as representative polyethersulfone (PES) resin.

In addition, any of materials that have light transmitting property with respect to the light emitted from the organic EL element may be used for the light transmissive substrate and the light transmissive layer of the present invention. For example, a substrate formed of porous silica or resin in addition to the glass may be used.

The light transmissive layer in contact with the high refractive index layer of the present invention has a refractive index lower than those of the rest light transmissive layers, however, preferably has a refractive index of 1.3 or less. Porous silica may be used for the light transmissive layer having the refractive index of 1.3 or less.

Required interface shape may be formed by any methods when the interface between the light transmissive substrate and the high refractive index layer is roughed. For example, a polishing method, a back sputtering method, a method for forming a thin layer with coverage of 1 or less and performing etching using the thin layer as a mask, or a method for using surface unevenness of the light transmissive layer comprised of porous silica as it is may be used. Its procedure may include having the light transmissive substrate roughed and forming the high refractive index layer thereon, or having the high refractive index layer roughed and forming the light transmissive substrate thereon.

Of these methods, when the light transmissive substrate is roughed by performing back sputtering or dry etching and forming $Si_3N_4$ thereon by means of plasma CVD, each step may be performed under coherent vacuum condition, which allows to take an advantage of low cost. In addition, when the organic EL element is formed performing sputtering or vacuum evaporation, its whole processes may be performed during the vacuum condition to thereby further increase cost reduction.

Materials used for forming the thin layer with coverage of 1 or less, may include metals such as Au, Ag, Ni, Co, alloy thereof, or island shaped inorganic materials such as ITO which have been formed by means of general vacuum evaporation or sputtering or the like, or island shaped materials resulted from typical resist for photolithography that has been exposed and developed.

Wet etching or dry etching may be used for the etching, however, when the dry etching is used as mentioned above, significant cost reduction may be expected by combination of the dry etching and its subsequent processes.

Hereinafter, examples of the present invention will be described in detail, however, the present invention is not limited to these embodiments mentioned below.

FIRST EXAMPLE

A structure of the light emitting diode of the first example is shown in FIG. 1. Back sputtering using Ar was performed on a glass substrate until the center line average roughness of the substrate surface was 0.01 μm. On top of that, $Si_3N_4$ was formed to have 1.2 μm thickness by means of plasma CVD. The refractive index of the obtained $Si_3N_4$ layer was 1.98. The $Si_3N_4$ layer was planarized by polishing. On top of that, ITO was formed to be a stripe shape having respective 80 μm in width and 120 μm in space using a sputtering method so as to have a sheet resistance of 20 Ω/□, which is a first electrode 2. Compound denoted as the formula 14 as a hole transporting layer 3 was formed to a thickness of 20 nm on the first electrode 2 by means of vacuum evaporation. On top of that, compound denoted as the formula 1 was formed as the light-emitting layer 4 to have 50 nm in thickness by means of vacuum evaporation. Compound denoted as the formula 18 was then formed as the electron transporting layer 5 to have 20 nm in thickness by means of vacuum evaporation. Mg—Ag alloy was formed to be a stripe as a second electrode 6 having respective 80 μm in width, 120 μm in space, and 200 nm in thickness by means of vacuum evaporation through a mask so as to have the stripe perpendicular to the stripe of the first electrode, which results in fabrication of the light emitting diode. A DC voltage of 10V was in turn applied to each organic EL element of the light emitting diode, so that a luminance of 10050 cd/m² was obtained without light leakage from each organic EL element into adjacent pixels.

SECOND EXAMPLE

The light emitting diode was fabricated using the same procedure as the first example except that back sputtering was performed on a glass substrate until the center line average roughness of the substrate surface was 0.05 μm. A DC voltage of 10V was in turn applied to each organic EL element of the light emitting diode, so that a luminance of 11000 cd/m² was obtained without light leakage from each organic EL element into adjacent pixels.

THIRD EXAMPLE

The light emitting diode was fabricated using the same procedure as the first example except that back sputtering was performed on a glass substrate until the center line average roughness of the substrate surface was 0.6 μm. A DC voltage of 10V was in turn applied to each organic EL element of the light emitting diode, so that a luminance of 10100 cd/m² was obtained without light leakage from each organic EL element into adjacent pixels.

FOURTH EXAMPLE

The light emitting diode was fabricated using the same procedure as the first example except that back sputtering was performed on a glass substrate until the center line average roughness of the substrate surface was 0.05 μm and until the developing area ratio was 1.03. A DC voltage of 10V was in turn applied to each organic EL element of the light emitting diode, so that a luminance of 12000 cd/m² was obtained without light leakage from each organic EL element into adjacent pixels.

FIFTH EXAMPLE

The light emitting diode was fabricated using the same procedure as the fourth example except that thickness of $Si_3N_4$ layer was 0.4 μm. A DC voltage of 10V was in turn applied to each organic EL element of the light emitting diode, so that a luminance of 10900 cd/m² was obtained without light leakage from each organic EL element into adjacent pixels.

SIXTH EXAMPLE

The light emitting diode was fabricated using the same procedure as the fourth example except that thickness of $Si_3N_4$ layer was 2 μm. A DC voltage of 10V was in turn applied to each organic EL element of the light emitting diode, so that a luminance of 11000 cd/m² was obtained without light leakage from each organic EL element into adjacent pixels.

SEVENTH EXAMPLE

Au was formed on a quartz glass substrate by DC sputtering equipment under conditions of 2 mA in current and 120 seconds in formation time. To this end, reactive ion etching was performed using $CF_4$ gas at a pressure of 2.6 Pa under conditions of 100 W in RF power and 233 seconds in etching time. After the etching is performed, Au was removed by aqua regia. The resultant glass substrate surface was roughed to have a center line roughness of 0.02 μm and a developing area ratio of 1.25. On top of that, $Si_3N_4$ was formed to have 1□ thickness by means of plasma CVD. The refractive index of the obtained $Si_3N_4$ layer was 1.98. This $Si_3N_4$ layer was planarized by polishing, and ITO was formed thereon to be a stripe shape having respective 80 μm in width and 120 μm in space so as to have a sheet resistance of 20 Ω/□, which is a first electrode 2. Compound denoted as the formula 14 as the hole transporting layer 3 was formed to a thickness of 20 nm on the first electrode 2 by means of vacuum evaporation. On top of that, compound denoted as the formula 1 was formed as the light-emitting layer 4 to have 50 nm in thickness by means of vacuum evaporation. Compound denoted as the formula 18 was then formed as the electron transporting layer 5 to have 20 nm in thickness by means of vacuum evaporation. Mg—Ag alloy was then formed to be a stripe as a second electrode 6 having respective 80 μm in width, 120 μm in space, and 200 nm in thickness by means of vacuum evaporation through a mask so as to have the stripe perpendicular to stripe of the first electrode, which results in the fabricated light emitting diode. A DC voltage of 10V was in turn applied to each organic EL element of the light emitting diode, so that a luminance of 13200 cd/m² was obtained without light leakage from each organic EL element into adjacent pixels.

EIGHTH EXAMPLE

Au was formed on a glass substrate by DC sputtering equipment under conditions of 2 mA in current and 120 seconds in formation time. To this end, reactive ion etching was performed using $CF_4$ gas at a pressure of 2.6 Pa under conditions of 100 W in RF power and 233 seconds in etching time. After the etching is performed, Au was removed by aqua regia. The resultant glass substrate surface was roughed to have a center line roughness of 0.02 μm and a developing area ratio of 1.25. On top of that, $ZrO_2$ was formed to have 1.8 μm thickness by means of vacuum evaporation. This $ZrO_2$ layer was then planarized by polishing, and ITO was formed thereon to be a stripe shape having respective 80□ in width and 120 μm in space so as to have a sheet resistance of 20 Ω/□, which is a first electrode 2. Compound denoted as the formula 14 as the hole transporting layer 3 was formed to a thickness of 20 m on the first electrode 2 by means of vacuum evaporation. On top of that, compound denoted as the formula 1 was formed as the light-emitting layer 4 to have 50 nm in thickness by means of vacuum evaporation. Compound denoted as the formula 18 was then formed as the electron transporting layer 5 to have 20 nm in thickness by means of vacuum evaporation. Mg—Ag alloy was then formed to be a stripe as a second electrode 6 having respective 80 μm in width, 120 μm in space, and 200 nm in thickness by means of vacuum evaporation through a mask so as to have the stripe perpendicular to stripe of the first electrode, which results in the fabricated light emitting diode. A DC voltage of 10V was in turn applied to each organic EL element of the light emitting diode, so that a luminance of 13800 cd/m² was obtained without light leakage from each organic EL element into adjacent pixels.

NINTH EXAMPLE

Co was formed on a glass substrate by DC sputtering equipment under conditions of 200 W in RF output and 400 seconds in formation time. To this end, reactive ion etching was performed using $CF_4$ gas at a pressure of 2.6 Pa under conditions of 100 W in RF power and 233 seconds in etching time. After the etching is performed, Co was removed by aqua regia. The resultant glass substrate surface was roughed to have a center line roughness of 0.04□ and a developing area ratio of 1.10. On top of that, Si$_3$N$_4$ was formed to have 1.2 μm thickness by means of plasma CVD. This Si$_3$N$_4$ layer was then planarized by polishing, and ITO was formed thereon to be a stripe shape having respective 80 μm in width and 120 μm in space so as to have a sheet resistance of 20 Ω/□, which is a first electrode 2. Compound denoted as the formula 14 as the hole transporting layer 3 was formed to a thickness of 20 m on the first electrode 2 by means of vacuum evaporation. On top of that, compound denoted as the formula 1 was formed as the light-emitting layer 4 to have 50 nm in thickness by means of vacuum evaporation. Compound denoted as the formula 18 was then formed as the electron transporting layer 5 to have 20 nm in thickness by means of vacuum evaporation. Mg—Ag alloy was then formed to be a stripe as a second electrode 6 having respective 80 μm in width, 120 μm in space, and 200 nm in thickness by means of vacuum evaporation through a mask so as to have the stripe perpendicular to stripe of the first electrode, which results in the fabricated light emitting diode. A DC voltage of 10V was in turn applied to each organic EL element of the light emitting diode, so that a luminance of 13700 cd/m$^2$ was obtained without light leakage from each organic EL element into adjacent pixels.

TENTH EXAMPLE

The light emitting diode was fabricated using the same procedure as the ninth example except that ITO instead of Co was formed on a glass substrate by RF sputtering equipment under conditions of 200 W in RF output and 200 seconds in formation time. The glass substrate surface was roughed to have a center line roughness of 0.02 μm and a developing area ratio of 2.05 before Si$_3$N$_4$ layer was formed. A DC voltage of 10V was in turn applied to each organic EL element of the light emitting diode, so that a luminance of 14000 cd/m$^2$ was obtained without light leakage from each organic EL element into adjacent pixels.

ELEVENTH EXAMPLE

The light emitting diode was fabricated using the same procedure as the ninth example except that Ag instead of Co was formed on a glass substrate by vacuum evaporation to have a thickness of 100 Å and 1.2 μm thick ZrN layer was used as the high refractive index layer. The glass substrate surface was roughed to have a center line roughness of 0.03 μm and a developing area ratio of 2.10 before ZrO$_2$ layer was formed. A DC voltage of 10V was in turn applied to each organic EL element of the light emitting diode, so that a luminance of 15000 cd/m$^2$ was obtained without light leakage from each organic EL element into adjacent pixels.

TWELFTH EXAMPLE

The structure of the light emitting diode of the twelfth example is shown in FIG. 2. Coating solution mixed with ethanol, butylcellosolve, and silica sol in which reactant obtained from tetraetoxysilane, ethanol, and oxalic acid and silica grain with a grain diameter of 15 nm were distributed in methanol, was applied onto the glass substrate by spin coater, and it was heated at a temperature of 300° C. to be cured with 1000 Å in thickness. The refractive index of the obtained layer was 1.28. Back sputtering using Ar with respect to the glass substrate was performed until the center line average roughness of the substrate surface was 0.03 μm. On top of that, Si$_3$N$_4$ was formed to have 12 μm thickness by means of plasma CVD. The refractive index of the obtained Si$_3$N$_4$ layer was 1.98. This Si$_3$N$_4$ layer was planarized by polishing, and ITO was formed thereon to be a stripe shape having respective 80□ in width and 120 μm in space so as to have a sheet resistance of 20 Ω/□, which is a first electrode 2. Compound denoted as the formula 14 as the hole transporting layer 3 was formed to a thickness of 20 nm on the first electrode 2 by means of vacuum evaporation. On top of that, compound denoted as the formula 1 was formed as the light-emitting layer 4 to have 50 nm in thickness by means of vacuum evaporation. Compound denoted as the formula 18 was then formed as the electron transporting layer 5 to have 20 nm in thickness by means of vacuum evaporation. Mg—Ag alloy was formed to be a stripe as a second electrode 6 having respective 80 μm in width, 120 μm in space, and 200 nm in thickness by means of vacuum evaporation through a mask so as to have the stripe perpendicular to the stripe of the first electrode, which results in fabrication of the light emitting diode. A DC voltage of 10V was in turn applied to each organic EL element of the light emitting diode, so that a luminance of 15000 cd/m$^2$ was obtained without light leakage from each organic EL element into adjacent pixels.

THIRTEENTH EXAMPLE

The light emitting diode was fabricated using the same procedure as the ninth example except that ZrO$_2$ instead of Si$_3$N$_4$ layer was formed on a glass substrate by vacuum evaporation to have a thickness of 1.2 μm. A DC voltage of 10V was in turn applied to each organic EL element of the light emitting diode, so that a luminance of 15300 cd/m$^2$ was obtained without light leakage from each organic EL element into adjacent pixels.

FOURTEENTH EXAMPLE

Coating solution mixed with ethanol, butylcellosolve, and silica sol in which reactant obtained from tetraetoxysilane, ethanol, and oxalic acid and silica grain with a grain diameter of 15 nm were distributed in methanol, was applied onto the glass substrate by spin coater, and it was heated at a temperature of 300° C. to be cured with 1000 Å (i.e., 100 nm) in thickness. The refractive index of the obtained layer was 1.28. Co formed thereon by RF sputtering equipment under conditions of 200 W in RF output and 400 seconds in formation time. To this end, reactive ion etching was performed using CF$_4$ gas at a pressure of 2.6 Pa under conditions of 100 W in RF power and 80 seconds in etching time. After the etching is performed, Co was removed by aqua regia. The resultant substrate surface was roughed to have a center line roughness of 0.07 μm and a developing area ratio of 1.15. On top of that, Si$_3$N$_4$ was formed to have 1.2 μm thickness by means of plasma CVD. The refractive index of the obtained Si$_3$N$_4$ layer was 1.98. This Si$_3$N$_4$ layer was planarized by polishing, and ITO was formed thereon to be a stripe shape having respective 80 μm in width and 120 μm in space so as to have a sheet resistance of 20 Ω/□, which is a first electrode 2. Compound denoted as the formula 14 as the hole transporting layer 3 was formed to a thickness of 20 nm on the first electrode 2 by means of vacuum evaporation. On top of that, compound denoted as the formula 1 was formed as the light-emitting layer 4 to have 50 nm in thickness by means of vacuum evaporation. Compound denoted as the formula 18 was then formed as the electron transporting layer 5 to have 20 nm in thickness by means of vacuum evaporation. Mg—Ag alloy was then formed to be a stripe as a second electrode 6 having respective 80 μm in width, 120 μm in space, and 200 nm in thickness by means of vacuum evaporation through a mask so as to have the stripe perpendicular to stripe of the first electrode, which results in the fabricated light emitting diode. A DC voltage of 10V was in turn applied to each organic EL element of the light emitting diode, so that a luminance of 15900 cd/m² was obtained without light leakage from each organic EL element into adjacent pixels.

FIFTEENTH EXAMPLE

Back sputtering using Ar was performed on a glass substrate until the center line average roughness of the substrate surface was 0.01 μm. On top of that, $Si_3N_4$ was formed to have 1.2 μm thickness by means of plasma CVD. The refractive index of the obtained $Si_3N_4$ layer was 1.98. This $Si_3N_4$ layer was planarized by polishing. On top of that, ITO was formed to be a stripe shape having respective 80 μm in width and 120 μm in space so as to have a sheet resistance of 20 Ω/□, which is a first electrode 2. Compound denoted as the formula 5 as the light-emitting layer 4 was formed to a thickness of 100 nm on the first electrode 2 by means of vacuum evaporation. Mg—Ag alloy was then formed to be a stripe as a second electrode 6 having respective 80 μm in width, 120 μm in space, and 200 nm in thickness by means of vacuum evaporation through a mask so as to have the stripe perpendicular to the stripe of the first electrode, which results in fabrication of the light emitting diode. A DC voltage of 10V was in turn applied to each organic EL element of the light emitting diode, so that a luminance of 4050 cd/m² was obtained without light leakage from each organic EL element into adjacent pixels.

SIXTEENTH EXAMPLE

Back sputtering using Ar was performed on a glass substrate until the center line average roughness of the substrate surface was 0.01 μm. On top of that, $Si_3N_4$ was formed to have 1.2 μm thickness by means of plasma CVD. The refractive index of the obtained $Si_3N_4$ layer was 1.98. This $Si_3N_4$ layer was planarized by polishing. On top of that, ITO was formed to be a stripe shape having respective 80 μm in width and 120 μm in space so as to have a sheet resistance of 20 Ω/□, which is a first electrode 2. Compound denoted as the formula 14 as the hole transporting layer 3 was formed to a thickness of 20 nm on the first electrode 2 by means of vacuum evaporation. On top of that, compound denoted as the formula 1 was formed as the light-emitting layer 4 to have 50 nm in thickness by means of vacuum evaporation. Mg—Ag alloy was then formed to be a stripe as a second electrode 6 having respective 80 μm in width, 120 μm in space, and 200 nm in thickness by means of vacuum evaporation through a mask so as to have the stripe perpendicular to stripe of the first electrode, which results in the fabricated light emitting diode. A DC voltage of 10V was in turn applied to each organic EL element of the light emitting diode, so that a luminance of 8500 cd/m² was obtained without light leakage from each organic EL element into adjacent pixels.

SEVENTEENTH EXAMPLE

Back sputtering using Ar was performed on a glass substrate until the center line average roughness of the substrate surface was 0.01 μm. On top of that, $Si_3N_4$ was formed to have 1.2 μm thickness by means of plasma CVD. The refractive index of the obtained $Si_3N_4$ layer was 1.98. This $Si_3N_4$ layer was planarized by polishing. On top of that, ITO was formed to be a stripe shape having respective 80 μm in width and 120 μm in space so as to have a sheet resistance of 20 Ω/□, which is a first electrode 2. Compound denoted as the formula 14 as the hole transporting layer 3 was formed to a thickness of 20 nm on the first electrode 2 by means of vacuum evaporation. On top of that, compound denoted as the formula 1 was formed as the light-emitting layer 4 to have 50 nm in thickness by means of vacuum evaporation. Compound denoted as the formula 18 was then formed as the electron transporting layer 5 to have 20 nm in thickness by means of vacuum evaporation. Mg—Ag alloy was formed to be a stripe as a second electrode 6 having respective 80 μm in width, 120 μm in space, and 200 nm in thickness by means of vacuum evaporation through a mask so as to have the stripe perpendicular to the stripe of the first electrode, which results in fabrication of the light emitting diode. A DC voltage of 10V was in turn applied to each organic EL element of the light emitting diode, so that a luminance of 9050 cd/m² was obtained without light leakage from each organic EL element into adjacent pixels.

FIRST COMPARATIVE EXAMPLE

The light emitting diode was fabricated using the same procedure as the first example except that back sputtering was not performed onto the glass substrate. When a DC voltage of 10V was in turn applied to each organic EL element of the light emitting diode, a luminance of 3000 cd/m² was obtained from each element, however, when each pixel was turned on, light leakage was observed from pixel regions adjacent to the pixel.

In accordance with the organic EL element of the present invention, light leakage may be effectively prevented to improve light extraction efficiency, and the light emitting diode and display device with superior performance may be provided.

What is claimed is:

1. A light emitting diode, comprising:
a high refractive index layer on a light transmissive substrate; and
an organic electroluminescence (EL) element formed of one organic thin layer or a plurality of organic thin layers interposed between a transparent first electrode and a second electrode,
wherein the high refractive index layer has a refractive index higher than that of an emitting layer, and an interface between the high refractive index layer and the light transmissive substrate has its center line average roughness in a range of 0.01 μm to 0.6 μm, and
wherein the interface between the light transmissive substrate and the high refractive index layer has a developing area ratio of at least 1.02.

2. The light emitting diode as claimed in claim 1, wherein the high refractive index layer is formed of $Si_3N_4$.

3. The light emitting diode as claimed in claim 1, wherein the light transmissive substrate is formed of a plurality of light transmissive layers, and the light transmissive layer in contact with the high refractive index layer has a refractive index lower than those of the rest light transmissive layers.

4. The light emitting diode as claimed in claim 3, wherein the light transmissive layer in contact with the high refractive index layer is formed of porous silica.

5. The light emitting diode as claimed in claim 1, wherein the interface between the high refractive index layer and the light transmissive substrate is shaped by a back sputtering method with respect to the light transmissive substrate.

6. The light emitting diode as claimed in claim 1, wherein the high refractive index layer has a thickness of 0.4 μm to 2 μm.

7. A display device in which the light emitting diodes claimed in claim 1 are arranged in a plurality of pixels.

8. A light emitting diode, comprising:
a high refractive index layer on a light transmissive substrate; and
an organic electroluminescence (EL) element formed of one organic thin layer or a plurality of organic thin layers interposed between a transparent first electrode and a second electrode,
wherein the high refractive index layer has a refractive index of at least 1.65, and an interface between the high refractive index layer and the light transmissive substrate has its center line average roughness in a range of 0.01 μm to 0.6μm,
wherein the interface between the light transmissive substrate and the high refractive index layer has a developing area ratio of at least 1.02.

9. The light emitting diode as claimed in claim 8, wherein the high refractive index layer is formed of $Si_3N_4$.

10. The light emitting diode as claimed in claim 8, wherein the light transmissive substrate is formed of a plurality of light transmissive layers, and the light transmissive layer in contact with the high refractive index layer has a refractive index lower than those of the rest light transmissive layers.

11. The light emitting diode as claimed in claim 10, wherein the light transmissive layer in contact with the high refractive index layer is formed of porous silica.

12. The light emitting diode as claimed in claim 8, wherein the interface between the high refractive index layer and the light transmissive substrate is shaped by a back sputtering method with respect to the light transmissive substrate.

13. The light emitting diode as claimed in claim 8, wherein the high refractive index layer has a thickness of 0.4 μm to 2 μm.

14. A display device in which the light emitting diodes claimed in claim 8, are arranged in a plurality of pixels.

* * * * *

UNITED STATES PATENT AND TRADEMARK OFFICE
CERTIFICATE OF CORRECTION

| | | |
|---|---|---|
| PATENT NO. | : 7,598,669 B2 | Page 1 of 1 |
| APPLICATION NO. | : 10/509800 | |
| DATED | : October 6, 2009 | |
| INVENTOR(S) | : Toguchi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 703 days.

Signed and Sealed this

Twenty-eighth Day of September, 2010

David J. Kappos
*Director of the United States Patent and Trademark Office*